United States Patent
Shrubsole et al.

(10) Patent No.: US 10,677,854 B2
(45) Date of Patent: Jun. 9, 2020

(54) APPARATUS AND METHODS FOR GATHERING AND USING OPERATING DATA FROM A LIGHTING PRODUCT

(71) Applicant: SIGNIFY HOLDING B.V., Eindhoven (NL)

(72) Inventors: Paul Anthony Shrubsole, Arnhem (NL); Abraham Rudolf Balkenende, Heeze (NL); Evgeni Arkad'Evich Patent, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 809 days.

(21) Appl. No.: 14/407,329

(22) PCT Filed: Jun. 6, 2013

(86) PCT No.: PCT/IB2013/054646
§ 371 (c)(1),
(2) Date: Dec. 11, 2014

(87) PCT Pub. No.: WO2013/186670
PCT Pub. Date: Dec. 19, 2013

(65) Prior Publication Data
US 2015/0120246 A1 Apr. 30, 2015

Related U.S. Application Data

(60) Provisional application No. 61/659,490, filed on Jun. 14, 2012.

(51) Int. Cl.
*G01R 31/44* (2020.01)
*H05B 47/175* (2020.01)

(52) U.S. Cl.
CPC ............ *G01R 31/44* (2013.01); *H05B 47/175* (2020.01)

(58) Field of Classification Search
CPC .......................... G01R 31/44; H05B 37/0245
USPC ............................................................ 702/182
See application file for complete search history.

(56) References Cited

U.S. PATENT DOCUMENTS

| | | | |
|---|---|---|---|
| 7,606,679 B1 | 10/2009 | Voicu et al. | |
| 2001/0005172 A1 | 6/2001 | Miyashita et al. | |
| 2002/0140379 A1 | 10/2002 | Chevalier et al. | |
| 2004/0227970 A1* | 11/2004 | Ohara | B41J 29/38 358/1.13 |
| 2005/0002054 A1* | 1/2005 | Shoji | G06F 3/1204 358/1.14 |

(Continued)

*Primary Examiner* — Yoshihisa Ishizuka
(74) *Attorney, Agent, or Firm* — Meenakshy Chakravorty (57) ABSTRACT

A system, method, and apparatus for gathering operating information from a lighting product. The lighting product includes an embedded persistent memory unit and processor configured to store data operating parameters in the memory unit. The memory unit may be accessed up through and after end-of-life of the lighting product. The memory unit may be physically removable, or may be accessible via a wired or wireless interface such as an NFC tag. The lighting product memory unit is accessed at an in-store kiosk by plugging the lighting product into a socket or swiping the lighting product with an NFC tag reader. Data recovered from the memory unit is used to select and display a range of suitable replacement lighting products from a database.

20 Claims, 6 Drawing Sheets

(56) References Cited

U.S. PATENT DOCUMENTS

| | | | |
|---|---|---|---|
| 2005/0154562 A1* | 7/2005 | Matsuura | G06F 11/008 |
| | | | 702/185 |
| 2005/0177450 A1* | 8/2005 | Menninger | G06Q 10/087 |
| | | | 705/26.1 |
| 2006/0193133 A1 | 8/2006 | Von Der Brelie | |
| 2008/0059120 A1* | 3/2008 | Xiao | G06F 11/008 |
| | | | 702/184 |
| 2008/0275727 A1 | 11/2008 | Koo et al. | |
| 2009/0237011 A1 | 9/2009 | Shah | |
| 2010/0161546 A1* | 6/2010 | Yamada | G06N 5/04 |
| | | | 706/54 |
| 2011/0035404 A1* | 2/2011 | Morgan | H05B 37/029 |
| | | | 707/769 |
| 2013/0067266 A1* | 3/2013 | Gearing | G06F 11/008 |
| | | | 714/4.1 |

* cited by examiner

APPARATUS AND METHODS FOR GATHERING AND USING OPERATING DATA FROM A LIGHTING PRODUCT

CROSS-REFERENCE TO PRIOR APPLICATIONS

This application is the U.S. National Phase application under 35 U.S.C. § 371 of International Application No. PCT/IB2013/054646, filed on Jun. 6, 2013, which claims the benefit of U.S. Provisional Patent Application No. 61/659, 490, filed on Jun. 14, 2012. These applications are hereby incorporated by reference herein.

TECHNICAL FIELD

The present invention is directed generally to lighting systems. More particularly, various inventive methods and apparatus disclosed herein relate to gathering operating data for use after end-of-life of a lighting product.

BACKGROUND

Digital lighting technologies, i.e. illumination based on semiconductor light sources, such as light-emitting diodes (LEDs), offer a viable alternative to traditional fluorescent, HID, and incandescent lamps. Functional advantages and benefits of LEDs include high energy conversion and optical efficiency, durability, lower operating costs, and many others. Recent advances in LED technology have provided efficient and robust full-spectrum lighting sources that enable a variety of lighting effects in many applications.

Many users are not sufficiently knowledgeable regarding which lighting products may best suit their needs and preferences. For example, functional and atmospheric lighting quality and intensity, lifetime, uniformity, energy saving features, et cetera, are difficult to translate to the budget, tastes and lighting environment of a user. This is particularly applicable when considering LED-based products, since the range of options enabled by the technology becomes daunting, including, for example, design freedom, color and color temperature options, and intelligent control. To alleviate these difficulties, an increasing amount of advice is being offered online to help users in their product selection process, but these methods are cumbersome and intrusive.

In line with this trend, it is likely the cost of near field communication (NFC) technology will continue to decrease over the next five years, mainly due to the advent of its adoption by the mobile phone industry. Such technology, in particular, the use of NFC type-1/2 tags, currently cost about five cents per tag. Reduced price NFC tags offer opportunities for low cost data storage and communication that may have previously made such features impractical for some types of products.

Some known lighting fixtures include a multi-tap capacitor sensor to record lumen output measurements at the ballast coil. These lighting fixtures have internal memory for storing sensor data and data related to, for example, an operating schedule and various operational parameters. This stored data may be accessed while the lighting fixture is in operation to calculate power consumption and to adjust operating parameters, for example, to maintain a desired illumination level over the life of the lighting fixture.

Other known lighting fixtures include internal memory for storing operational data and information identifying the lighting fixture. These parameters may be externally accessed from the in-service lighting fixture, for example, by a wireless connection, to identify a lighting fixture operating past peak efficiency. Operation of the lighting fixtures may be prevented if one or more of the stored parameters exceeds a reference value. In both of these prior art examples, the stored information is only accessible from an operational lighting fixture and used for controlling its operation.

Thus, there is a need in the art to overcome the problem of insufficient guidance regarding replacement lighting products that are tailored to user needs and preferences, without needing to rely on complex interactions for the user and the retail shop assistant or e-commerce stores, which is generally unfeasible in most retail environments or online shopping options due to the costs and time incurred to do this effectively.

SUMMARY

The present disclosure is directed to inventive methods, systems, and apparatus for gathering operating information from a lighting product for use after the end-of-life of the lighting product. For example, a lighting product may include a small embedded persistent memory unit and processor configured to store operating parameters in the memory unit. The memory may be accessed up through and after end-of-life of the lighting product. The memory may be physically removable, or may be accessible via a wired or wireless interface, for example, an NFC tag. The memory unit, processor, and/or the interface may be recovered from the lighting product after end-of-life for reuse. Stored data may include time of operation, intensity, color, user satisfaction information, product ID, and information about materials used in the lighting product for reclamation or safe disposal.

A method for recovering data from the persistent memory after end-of-life may include physically taking the lighting product to an in-store kiosk and plugging the lighting product into a socket or swiping it by a tag reader. Alternatively, data may be recovered by swiping a smart phone near the lighting product.

A system may process data recovered from the lighting product to select a range of suitable replacement lighting products from a database. The selection may be displayed on a kiosk video display or a smart phone screen. A similar system may be used to sort and/or route of end-of-life products, collected in a disposal bin.

Generally, in one aspect, the invention relates to a lighting product that includes a light source, an electrical connection, a persistent memory, and a processor configured to collect operating information and store the operating information in the persistent memory. The persistent memory is accessible after an end-of-life of the lighting product, and operating power is supplied to the light source and the processor by the electrical connection.

In one embodiment, the persistent memory is accessible after the end-of-life via the electrical connection. In another embodiment, the lighting product further includes a wireless interface in electrical communication with the persistent memory, wherein the persistent memory is accessible after the end-of-life via the wireless interface. The wireless interface may include a near field communication tag. The wireless interface and/or the persistent memory may be configured to be removed from the lighting product after the end-of-life.

Generally, in another aspect, the invention relates to a lighting recommender system that includes a processor, a lighting product interface in communication with the processor, a database accessible by the processor containing lighting product information, and a display device in communication with the processor. The processor is configured to perform the steps of accessing a memory in a source lighting product via the interface, recovering operating information from the memory, selecting a replacement lighting product for the source lighting product from the database based at least in part upon the operating information, and displaying the lighting product information for the replacement product on the display device.

In one embodiment, the source lighting product is an end-of-life lighting product. Under a first variation, selecting a replacement product for the source lighting product from the database based at least in part upon static source product information recovered from the memory. Under a second variation, the interface includes a first wireless interface in wireless communication with a second wireless interface of the source lighting product. Under a third variation, the interface includes a first wired interface in electrical communication with a second wired interface of the source lighting product.

Generally, in yet another aspect, the invention focuses on a computer implemented method that includes the steps of accessing a memory in a lighting product, recovering operating information from the memory, selecting a replacement product from a product database based upon the operating information, and displaying product information for the replacement product. The step of accessing the memory may occur after end-of-life of the lighting product. The method may further include the steps of receiving the lighting product in a socket and applying power to the socket, and/or the step of connecting to a wireless interface in the lighting product. One variation includes recovering static product information from the memory, and, optionally, sorting the lighting product based on the static product information.

Generally, in still another aspect, the invention relates to a computer readable medium that includes instructions to execute the steps of accessing a memory in a lighting product, recovering operating information from the memory, selecting a replacement product from a product database based upon the operating information and displaying product information for the replacement product.

Generally, in another aspect, the invention relates to a computer readable medium that includes instructions to execute the steps of accessing a memory in a lighting product determining operating information for the lighting product, and storing operating information in the memory. In one embodiment, the operating information includes user satisfaction data (i.e. positive and negative responses to lighting quality/performance in the context of usage).

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs).

The term "light source" should be understood to refer to any one or more of a variety of radiation sources, including, but not limited to, LED-based sources (including one or more LEDs as defined above.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. Black body radiator color temperatures generally fall within a range of from approximately 700 degrees K (typically considered the first visible to the human eye) to over 10,000 degrees K; white light generally is perceived at color temperatures above 1500-2000 degrees K.

The terms "lighting fixture" or "lighting product" are used interchangeably herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s).

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers. The term "persistent memory" is used herein to refer to a device that is configured to store information and retain information whether or not power is provided to the persistent memory.

The term "end-of-life" is used herein to refer to a device that has reached the end of its functional life. While the device may still function to some degree, it may not function within a set of predefined acceptable operating parameters. For example, an end-of-life lighting product may still produce light, but below a minimum acceptable illumination threshold at a given power level.

The term "user interface" as used herein refers to an interface between a human user or operator and one or more devices that enables communication between the user and the device(s). Examples of user interfaces that may be employed in various implementations of the present disclosure include, but are not limited to, switches, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Users of lighting products often discard end-of-life lighting products and select replacement lighting products without the benefit of having a full understanding of how a replacement product may be best suited to their specific usage of the end-of-life lighting product. An object of the invention is to help users choose a lighting product, for example, in a shop, by specifically employing the usage data accumulated from their previously owned lighting product as input to a recommender system. This dramatically eases the process of finding a lighting product from a potentially huge selection of LED options, whilst also encouraging users to return their end-of-life lighting products for value-reclamation and environmental purposes.

More generally, Applicants have recognized and appreciated that it would be beneficial to provide products and systems that store product and operational information that is used to provide guidance to lighting users when replacing end-of-life products. The problem of reclaiming the value of lighting products can be overcome, since the invention encourages users to bring their end-of-life lighting products back to the store. The invention enables transfer of data accumulated about the lighting product beyond the functional lifetime of the lighting product. The invention overcomes the problem of identifying lighting products during collection and recycling in order to close material loops. The invention overcomes the problem of users reverting to cheaper and inferior alternates to lighting products since users may not be aware of the consequences in the resulting lighting quality after installation.

In view of the foregoing, various embodiments and implementations of the present invention are directed to a lighting product, and systems and methods for recovering data from a persistent memory after end-of-life of the lighting product. Recovering data may include physically taking the lighting product to an in-store kiosk and plugging the lighting product into a socket, or swiping it by a tag reader. Alternatively, data may be recovered by swiping a smart phone near the lighting product.

Figure 1:
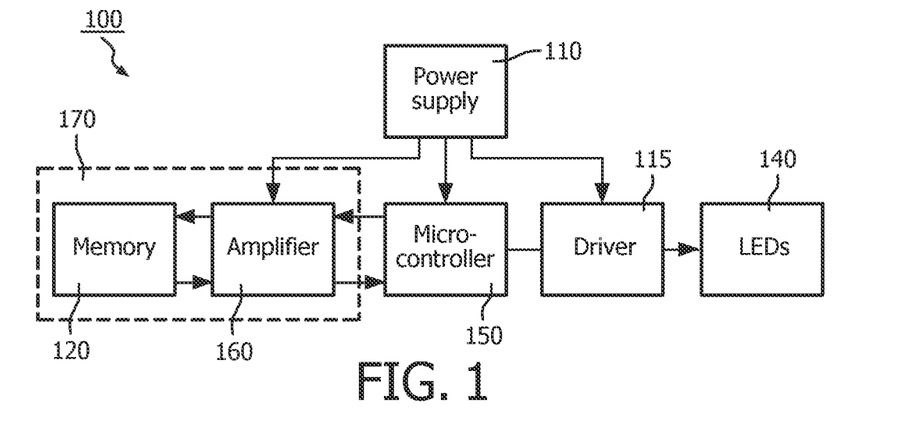
FIG. 1 illustrates a first embodiment of a lighting product having persistent memory.

As shown in FIG. 1, a first exemplary embodiment of a lighting product 100 of the current invention includes a power supply 110, a memory unit 120, an amplifier 160, a microcontroller 150, a driver 115, and one or more LEDs 140. The power supply 110 receives electric current through an electrical connector (not shown), and distributes power to the amplifier 160, the microcontroller 150, and the driver 115. The driver 115 drives the LEDs according to current operating settings, as controlled by the microcontroller 150. The microcontroller 150 is in communication with the memory unit 120 via the amplifier 160. The microcontroller may store operating parameters in the memory 120. The amplifier 160 amplifies a signal between the memory unit 120 and the microcontroller 150.

The memory unit 120 stores accumulated data about the lighting product 100, for example, usage information and user satisfaction levels during the lifetime of the lighting product 100. The data stored in the memory unit 120 may be read by another device beyond the functional lifetime of the lighting product 100 (after end-of-life of the lighting product 100). The accumulated data may be formatted into name and value pairs, where the values are, for example, proportional usage values or time-spent values, including lifetime until end-of-life. The collected usage data may relate to user preferences during the lifetime of the lighting product, which may then be fed into a recommender system, described below. Note that, since the written data is persistent, no standby power is required for the lighting product 100. This means that general settings data can also be stored without needing standby power between sessions.

Under the first embodiment, an NFC front-end electronics circuit 170 includes the memory unit 120, and the amplifier 160. The lighting product 100 may be configured so the NFC front-end electronics 170 may be physically recovered from the lighting product 100 after end-of-life. For example, the NFC front end electronics 170 may be located on a breakaway portion of a circuit board housing one or more of the microcontroller 150, driver 115, LEDs 140 and the power supply 110. Alternatively, the NFC front end electronics 170 may be contained in a socketed integrated circuit, for example, an ASIC, that may be pulled from the socket for re-deployment in another device.

Although the first embodiment is not dependent on the use of NFC tags in the lighting products 100, use of NFC tags offers value in terms storage and transfer of lighting preferences of any future lighting product as well as allowing the possibility of re-use, thereby reducing the total costs even further. The lighting product 100 may be, for example, an intelligent light source such as a lamp or module, with controllable illumination features such as dimming, color tuning, radio frequency control or coded light communication. Color tuning may include, for example, balancing the intensity levels of red, green and blue (RGB) LEDs. These controllable features may be controlled by control signals or control messages, for example, received through a wired or wireless interface. The control messages may include parameter settings used to control specific aspects of the quality of light produced by the lighting product 100. These parameter settings may be stored in the memory unit 120.

The memory unit 120 is configured to store operating information for the lighting product 100. The memory unit 120 may be configured in several memory sizes, for example, a 96 byte version and a 2 KB version, among others. The amount of accumulated operating information (data) stored in the memory unit 120, and the type of data accumulated may depend upon the memory size. A list of options for the accumulated data to support low memory requirements, for example, a 96 Byte NFC tag, is presented in Table 1:

TABLE 1 clock_secs:time in seconds form 1$^{st}$ usage (if space is limited, then clock_days is used instead)
intensity_avg: average intensity value from 0-100% of a maximum specified value Each parameter may be stored in name/value pairs, with the name field identifying the parameter, and the value indicating the level of the named parameter. Alternatively, space may be saved by omitting the parameter names, and instead storing parameters according to a mapped address space in the memory unit 120, such that the address of the parameter value indicates the parameter ID. Of course, other data storage techniques known to persons having ordinary skill in the art may be used. In addition, the data stored in the memory may be compressed to save memory space, so that the data is encoded before storing to the memory unit 120 and decoded when recovered from the memory unit 120.

In general, the parameters in Table 1 indicate the amount of time the lighting product 100 is active, and the intensity of the light produced over that time. Table 2 includes data that may be stored in the memory unit 120 in addition to the data shown in Table 1, space permitting, for example in a 2 KB version:

TABLE 2 intensity_band0_secs: time spent in lower range
intensity_band1_secs: time spent in mid range
intensity_band2_secs: time spent in upper range of intensity values
red_intensity_band0_secs: time spent in lower range
red_intensity_band1_secs: time spent in mid range
red_intensity_band2_secs: time spent in upper range of intensity values
green_intensity_band0_secs: time spent in lower range
green_intensity_band1_secs: time spent in mid range
green_intensity_band2_secs: time spent in upper range of intensity values
blue_intensity_band0_secs: time spent in lower range
blue_intensity_band1_secs: time spent in mid range
blue_intensity_band2_secs: time spent in upper range of intensity values To conserve space, a standard color lookup table may be used instead of the above parameters. It should be noted that additional types of parameter may also be stored. There is no particular constraint to the type of parameters stored, but parameters may generally be appropriate for the type of light source and range of controllable features. For advanced settings, such as lighting animations, the format of parameters such as intensity_color_timestamp values may be stored if they are used over a certain proportion threshold of the lifetime, for example, for the 2 KB version. Similarly, when more advanced user input is available, satisfaction statistics may also be stored in the memory unit 120 to capture a particular lighting property along with a level of user satisfaction with that lighting property. Such a lighting property may be, for example, the color of light produced by the lighting product 100, and the relative level of satisfaction indicated by a user. Satisfaction levels may be rough, for example, indicating "satisfied" or "not satisfied," or may be a range of values, for example a range from 0 to 15, where 0 represents completely unsatisfied and 15 represents completely satisfied. If storage is limited, parameter name/value pairs may be overwritten, for example if the satisfaction values go over or under a predefined threshold. To save space in the memory unit 120, parameter names may be encoded into identifiers and recovered later, for example via the recommender system, described below. This may include a standardization of these identifiers over lighting product families.

In addition to operating parameters, static information about the lighting product 100, for example, a serial number, a product ID, materials and methods of disposal and disassembly, may also be stored in the memory unit 120, depending on available memory. Static information does not change over the lifetime of the lighting product, and may be stored separately from the operating parameters, for example, in non-volatile memory, or may be stored in persistent volatile memory, along with the operating parameters.

Figure 2:
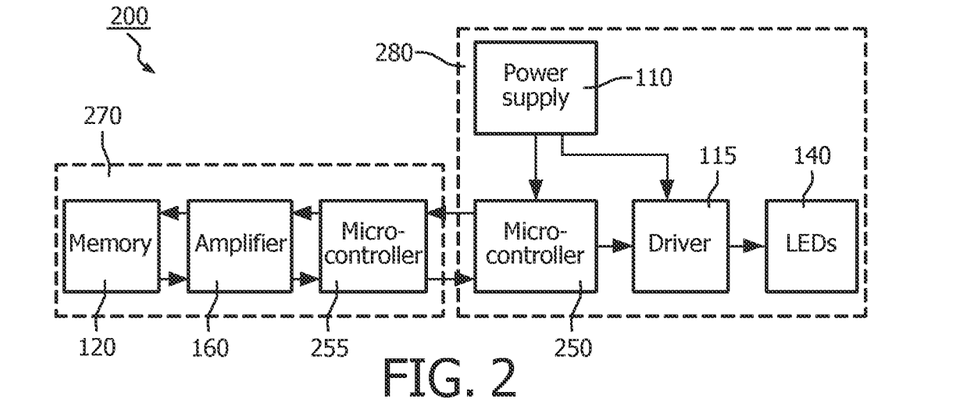
FIG. 2 illustrates a second embodiment of a lighting product having persistent memory.

FIG. 2 shows a block diagram of a second exemplary of lighting product 200. As with the first embodiment, under the second embodiment, the lighting product 200 includes a power supply 110, a memory unit 120, an amplifier 160, a driver 115, and one or more LEDs 140. Whereas the first embodiment included a single microcontroller 150 (FIG. 1), under the second embodiment a first micro controller 250 is in communication with a second microcontroller 255. The memory 120, amplifier 160, and second microcontroller 255 are part of an NFC module 270, while the power supply 110, first microcontroller 250, driver 115 and LEDs 140 are part of a lamp module 280. The NFC module 270 may further contain an NFC tag (not shown) and antenna (not shown), so that the lighting product 200 may communicate wirelessly with another device, as described further below. The NFC module 270 and the lamp module 280 may be formed on a single substrate or circuit board, where the NFC module 270 and/or the lamp module 280 is socketed, or the NFC module 270 is configured to break away from the lamp module 280 after end-of-life for recovery of the components.

Figure 3:
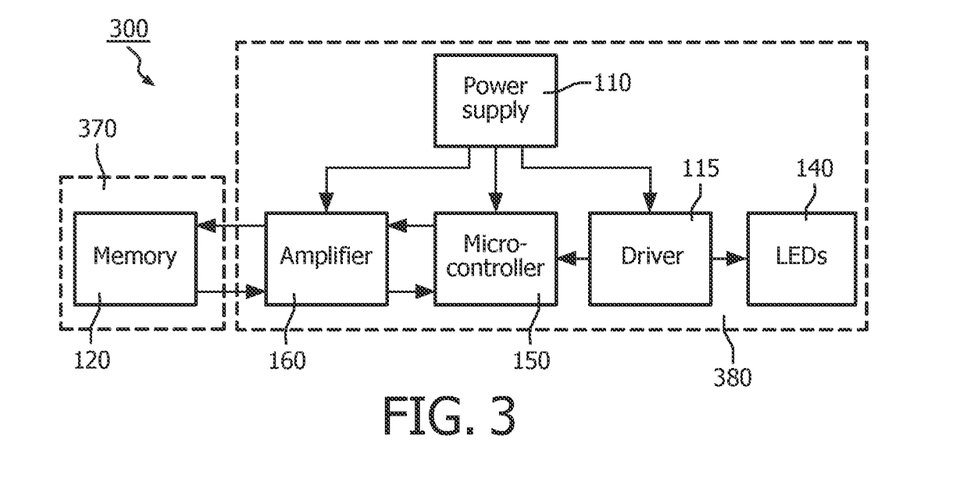
FIG. 3 illustrates a third embodiment of a lighting product having persistent memory.

FIG. 3 shows a block diagram of a third exemplary of lighting product 300. As with the first embodiment, under the third embodiment, the lighting product includes a power supply 110, a memory unit 120, a microcontroller 150, an amplifier 160, a driver 115, and one or more LEDs 140. In the third embodiment, the memory unit 120 and an antenna (not shown) are incorporated into a separate NFC module 370, where the remaining components are part of a lamp module 380. Under the third embodiment, the amplifier is part of the lamp module, so the memory unit 120 and antenna (not shown) may be separated for recovery from the lighting product 300 after end-of-life.

Under each of the first, second and third embodiments, the lighting product 100, 200, 300 may offer different levels of features and capabilities. In a first example, a very basic lighting product 100, 200, 300 may offer simple illumination features, on and off for example, without dimming, color tuning, and other features. It has a simple driver 115, which requires some external electronics to implement near field communication, such as the microcontroller 150, 250, 255, front-end electronics, memory 120 and an antenna (not shown). The external electronics may increase the cost of the lighting product 100, 200, 300. However, the additional costs may be offset by rapidly decreasing NFC costs with the adoption of NFC tagging for the smartphone market. Also the costs incurred may be justified, given value reclamation possibilities of reusable components, and offset by providing novel features the consumer may be willing to pay a premium for.

In a second example, an intelligent lighting product 100, 200, 300 may offer more sophisticated illumination features, such as dimming, color tuning, RF-control or Coded Light communication. In this example, the microcontroller 150, 250, 255 is generally more complex, so it is possible to reuse the available electronics to implement the NFC feature. However, an additional circuitry of the front-end electronics may still be used. Reuse of hardware may be difficult under the second example, for example, separating the NFC module at the end-of-life.

It should be noted that RF-control protocols, for example Zigbee and RFID (NFC) operate at different frequencies. This may limit reuse of the antenna and other electronics to reuse in very similar products. However, it is possible to integrate the RFID antenna into the design of the lighting product 100, 200, 300. In the case of luminaire integration, the costs of RFID per lighting product can be significantly reduced since the antenna may represent a significant portion of the cost of an NFC tag. It should be noted that integrating the NFC electronics into the luminaire may require collection of end-of-life information to be performed at the location where the luminaire is installed, due to the difficulty of moving the luminaire to an in-store kiosk, making wireless collection of end-of-life product information preferable.

Of course, the first example and second example represent very different levels of features and capabilities, and other examples may have intermediate levels or different features and capabilities. Generally, there are two options for a wireless antenna for the lighting product 100, 200, 300. An antenna may be included in each product, or can be electrically connected, for example, via the electrical power connections, at the point of detection.

The memory unit 120 may be removed from an end of life lighting product 100, 200, 300, together with the communication interface when the lighting product 100, 200, 300 is returned for disposal or recycling. The components may be re-used or re-purposed, for example, as an RFID tag for re-use in another lighting product 100, 200, 300 or in a completely different application, such as posters. This reuse is enabled by a memory unit 120 intended to function beyond the lifetime of the host electronics that enables read/write operations from the lighting product with the embedded memory unit 120. This means that the memory unit 120 can be made removable from end-of-life electronics by, for example, a fault line along part of the printed circuit board, or by a mechanism of plugging/unplugging the module in, for example, a socket.

Recommender System

Figure 4:
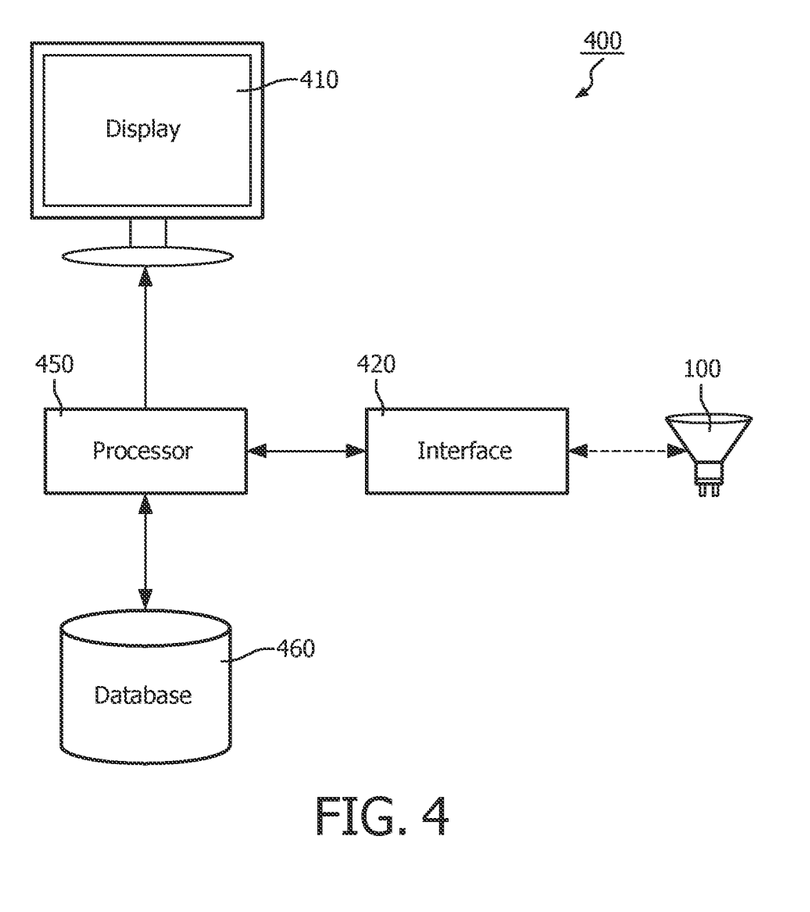
FIG. 4 is a schematic diagram of a recommender system for processing data from a lighting product.

FIG. 4 is a schematic diagram of an embodiment of a recommender system 400 linked to a database of lighting products and lighting features. In general, the recommender system 400 recovers data from a lighting product 100, described above, and uses the recovered data to recommend suitable replacement products based on, for example, the way the lighting product 100 was used and/or recorded user satisfaction information. The recovered data about the lighting product 100 and its usage, for example, the name/value pairs describe above, are used as input to the recommender system 400, and the recommender system 400 displays information about replacement lighting products and features that best match these values.

The recommender system 400 includes a processor 450, for example, a computer, a database 460, a display 410, and an interface 420. The database 460 includes information about replacement lighting products. The interface 420 communicates with a lighting product 100 to recover operating information from the lighting product 100, for example from persistent memory embedded in the lighting product 100. The interface 420 is described in further detail below. The processor 450 uses the recovered information to query the database 460. For example, the recovered information may indicate the lighting product 100 was frequently turned on and off. In this case, the processor 450 may formulate a query for replacement lighting products that quickly come up to full illumination when turned on. Alternatively, the recovered information may indicate the lighting product was left on for extended periods of time. In this case, the processor 450 may formulate a query for replacement lighting products that have relatively long peak illumination lifetimes. The processor 450 displays the results of the database query on the display 410. The display 410 may be, for example, a flat panel LCD display, an LED display, a plasma display, a CRT, or other display.

The lighting preferences and usage data relating to a particular lighting product 100 can be seamlessly transferred to the recommender system 400 in a variety of ways, up to and beyond the functional lifetime of the lighting product 100. The recommender system 400 may be located, for example, at a kiosk in a retail store. A user may physically bring an old or end-of-life lighting product 100 to the in-store kiosk, and plug the lighting product 100 into a socket or swipe it by a tag reader. Alternatively, the recommender system 400 may be incorporated in to a self-contained unit, for example, implemented as an application in a smart phone or tablet computer having a tag reader, where data may be recovered from the lighting product 100 by swiping the smart phone or tablet computer near the lighting product 100.

Figure 5:
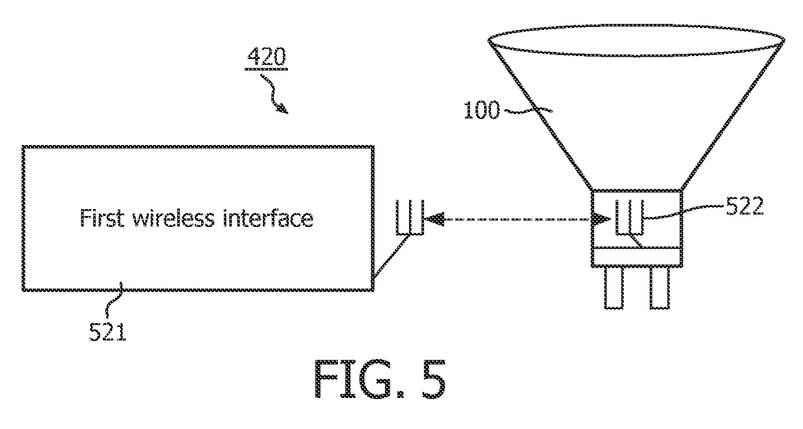
FIG. 5 is a schematic diagram of a wireless interface between a lighting product and a recommender system for processing data from a lighting product.

As described above, persistent memory in the lighting product 100 may be used to store lighting usage information that is transferred to the recommender system using near field communication, as shown by FIG. 5. The interface 420 includes first wireless interface 521 that is in wired communication with the processor 450 (FIG. 4) and also in wireless communication with a second wireless interface 522 included in the lighting product 100. The lighting product 100 may be supplied with electricity in proximity with the recommender system 400 (FIG. 4), so the second wireless interface may receive power to communicate with the first wireless interface 521. The processor 450 (FIG. 4) may then retrieve lighting usage information from the lighting product 100 via the wireless connection between the first wireless interface 521 and the second wireless interface 522.

Figure 6:
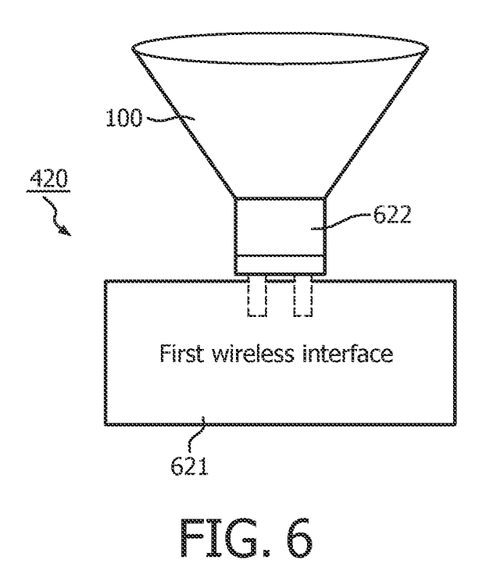
FIG. 6 is a schematic diagram of a wired interface between a lighting product and a recommender system for processing data from a lighting product.

Alternatively, as shown by FIG. 6, persistent memory in the lighting product 100 can be interfaced directly via a first wired interface 621 connected to a second wired interface 622 to the driver electronics or other electronic circuits hosted by the lighting product 100. The first wired interface 621 is in electrical communication with the processor 450 (FIG. 4). The lighting product 100 may be physically connected to the recommender system 400 (FIG. 4) to create a separate electrical circuit after end-of-life. The first wired interface 621 may include one or more standard lighting socket interfaces to receive, provide power to, and electrically connect to the lighting product 100. The processor 450 (FIG. 4) may then retrieve lighting usage information from the lighting product 100 via the wired connection between the first wired interface 621 and the second wired interface 622.

Figure 7:
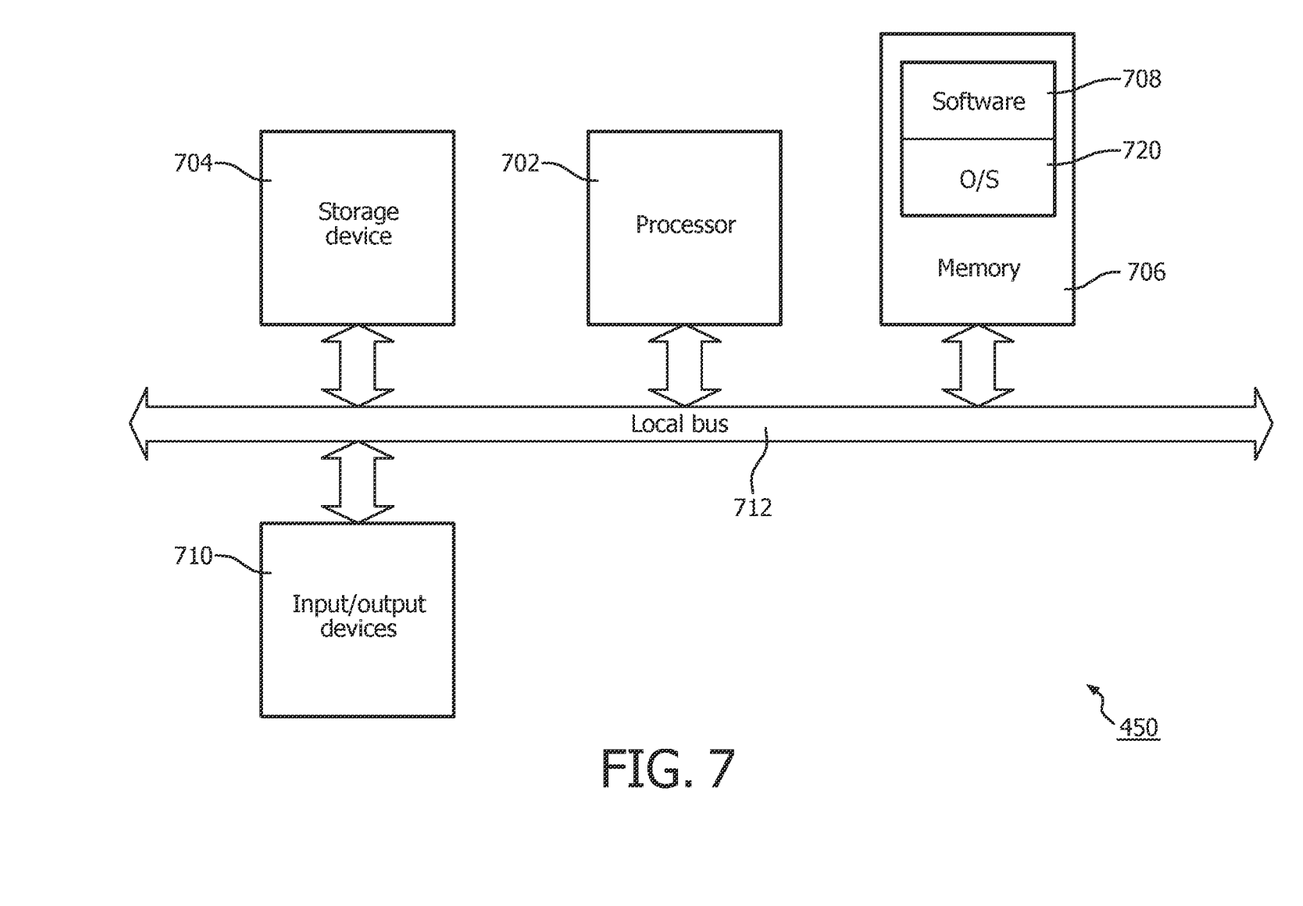
FIG. 7 is a schematic diagram illustrating an example of an architecture for executing functionality of the processor of a recommender system.

As previously mentioned, the processor 450 (FIG. 4) of the recommender system 400 (FIG. 4) may be a computer, an example of which is shown in the schematic diagram of FIG. 7. The processor 450 contains a processing unit 702, a storage device 704, a memory 706 having software 708 stored therein that defines the abovementioned functionality, input and output (I/O) devices 710 (or peripherals), and a local bus, or local interface 712 allowing for communication within the processor 450. The local interface 712 can be, for example but not limited to, one or more buses or other wired or wireless connections, as is known in the art. The local interface 712 may have additional elements, which are omitted for simplicity, such as controllers, buffers (caches), drivers, repeaters, and receivers, to enable communications. Further, the local interface 712 may include address, control, and/or data connections to enable appropriate communications among the aforementioned components.

The processing unit 702 is a hardware device for executing software, particularly that stored in the memory 706. The processing unit 702 can be any custom made or commercially available single core or multi-core processor, a central processing unit (CPU), an auxiliary processor among several processors associated with the present processor 450, a semiconductor based microprocessor (in the form of a microchip or chip set), a macroprocessor, or generally any device for executing software instructions.

The memory 706 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 706 may incorporate electronic, magnetic, optical, and/or other types of storage media. Note that the memory 706 can have a distributed architecture, where various components are situated remotely from one another, but can be accessed by the processing unit 702.

The software 708 defines functionality performed by the processor 450, in accordance with the present invention. The software 708 in the memory 706 may include one or more separate programs, each of which contains an ordered listing of executable instructions for implementing logical functions of the processor 450, as described below. The memory 706 may contain an operating system (O/S) 720. The operating system essentially controls the execution of programs within the processor 450 and provides scheduling, input-output control, file and data management, memory management, and communication control and related services.

The I/O devices 710 may include input devices, for example but not limited to, a keyboard, mouse, scanner, microphone, etc. Furthermore, the I/O devices 710 may also include output devices, for example but not limited to, a printer, display, etc. Finally, the I/O devices 710 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the processor 450 is in operation, the processing unit 702 is configured to execute the software 708 stored within the memory 706, to communicate data to and from the memory 706, and to generally control operations of the processor 450 pursuant to the software 708, as explained above.

Methods

Figure 8:
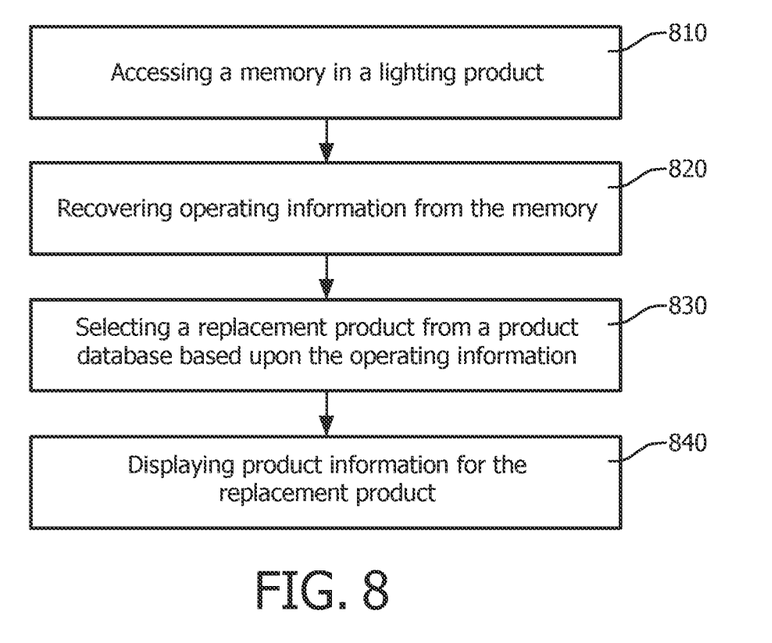
FIG. 8 is a flowchart of an exemplary method for recommending a replacement lighting product.

FIG. 8 is a block diagram of an exemplary method of transferring usage data from a lighting product to a recommender system. It should be noted that any process descriptions or blocks in flow charts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

A memory unit within the lighting product may be read without the lighting product being operational. The interface to the memory unit during normal usage for lighting is actively coupled to the electronics of lighting product for read/write operations, but does not depend on this active interface when reading the memory unit by an external device, for example, the recommender system. As described above, the memory unit is written to during regular operation to update settings data, for example including light intensity preference, color preference, lifetime, and other information.

Up to and after the time the lighting product reaches end-of-life, the user may bring the lighting product to a recommender system. For example, the recommender system may be in a retail store kiosk. As shown by block 810, a memory in the lighting product is accessed. For example, a lighting product user may swipe the lighting product at an NFC enabled kiosk so that the stored usage data is passively transferred to the recommender system. As shown by block 820, operating information is recovered from the memory of the lighting product. As shown by block 830, a replacement product is selected from a database based upon the operating information. For example, the recommender system may use the product information to generate a query to the database to find matches from a set of lighting-related features and known products in accordance with the usage patterns discerned from the operating information of the end-of-life lighting product. As shown by block 840, the product information for the selected replacement products is displayed, for example, on a video display unit in the kiosk. The recommender system may further interact with the user to further determine preferences of the lighting user to further refine the set of displayed recommended lighting products. The user may also filter or modify aspects of the suggested features to further refine the displayed set of replacement products.

Alternatively, the kiosk functionality described above may be replaced or complemented with, for example, an NFC-enabled smart-phone or tablet computer linked to a lighting product database and recommender system, either located remotely, or cached on the phone. The user may then swipe the lighting product over their phone at any time and retrieve information about the usage and can also look for additional lighting options linked to this usage via, for example an online shop.

The database may be updated based on the operating information recovered from stored memory. In this way, the kiosk may serve to accumulate user data that may be taken into account when recommending products. For example, the operating information may be used to enhance the product recommendation accuracy and granularity.

User Satisfaction Data

As mentioned above, in addition to the usage data accumulated by the lighting product itself, the lighting product may also accept and store user satisfaction data (feedback) when an appropriate means of inputting and communicating such information is available, for example via a remote control appliance with a code to reflect satisfaction or dissatisfaction of a particular lighting setting. The satisfaction data may then be stored in persistent memory with the lighting setting data to provide additional information to be processed by the recommender system 400 (FIG. 4) for selecting a new lighting product.

Figure 9:
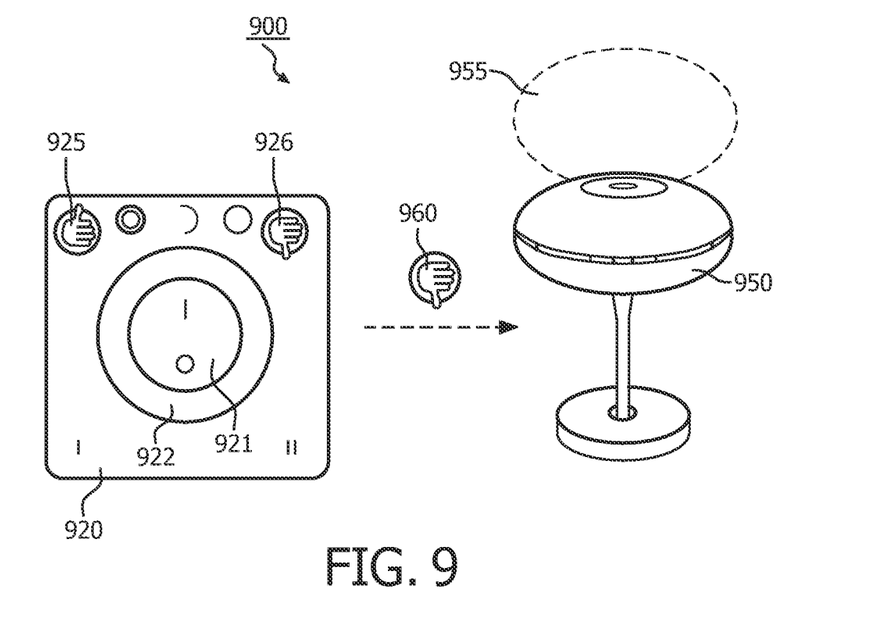
FIG. 9 is a schematic diagram of a user satisfaction gathering system.

FIG. 9 is a schematic diagram of an exemplary user satisfaction information gathering system 900. The system includes a remote control 920 for both controlling and reporting satisfaction feedback to a lighting product 950. The remote control 920 may communicate with the lighting product 950 wirelessly, for example, via Bluetooth or Zigbee, or the remote control 920 may be a wired remote. The remote control 920 may send both control parameters, for example, on/off and a selected color, and a feedback parameter 960 to the lighting product 950. The remote control 920 includes a power switch 921, for turning the lighting product 950 on and off, and a color wheel 922 for selecting a color of generated light 955 from the lighting product 950.

In addition, the remote control 920 includes a positive feedback button 925 and a negative feedback button 926, used to select the satisfaction parameter 960 sent to the lighting product 950. For example, if a user is satisfied with the color of generated light 955, the user may push the positive feedback button 925, and the remote control may as a result send satisfaction parameter 960 along with an operating parameter indicating the currently selected color as currently selected by the color wheel 922.

In an example scenario shown in FIG. 9, the user has indicated to the lighting product that he is not satisfied with color that he has selected with the color wheel 922. The lighting product 950 then stores the setting with a satisfaction level, for example, that has been statistically accumulated over time.

Reclamation

Some of the functionality of the recommender system described above may be used to leverage information recovered from an end-of-life lighting product during collection and recycling of end-of-life lighting products. The recovered information may include static information about the product, for example, its constituent materials and its methods of disassembly, that may recovered from the memory unit to aid in, for example automated sorting and recycling processes.

Under one exemplary scenario, having brought in an end-of-life lighting product to a store with a recommender system described above, a lighting product user discards an old lighting product at the time of or after the purchase of a replacement new product. The discarded lighting product may be identified and tracked during the collection and recycling phases using the same communication process as the recommender system. Alternatively, the recommender system may generate an identifying scan label for the discarded lighting product for use in reclamation/recycling. During reclamation, components from the lighting unit, for example, the memory unit and communication electronics (RFID tag), are separated from the lighting product for re-use into newer lighting products or for re-purposing.

Figure 10:
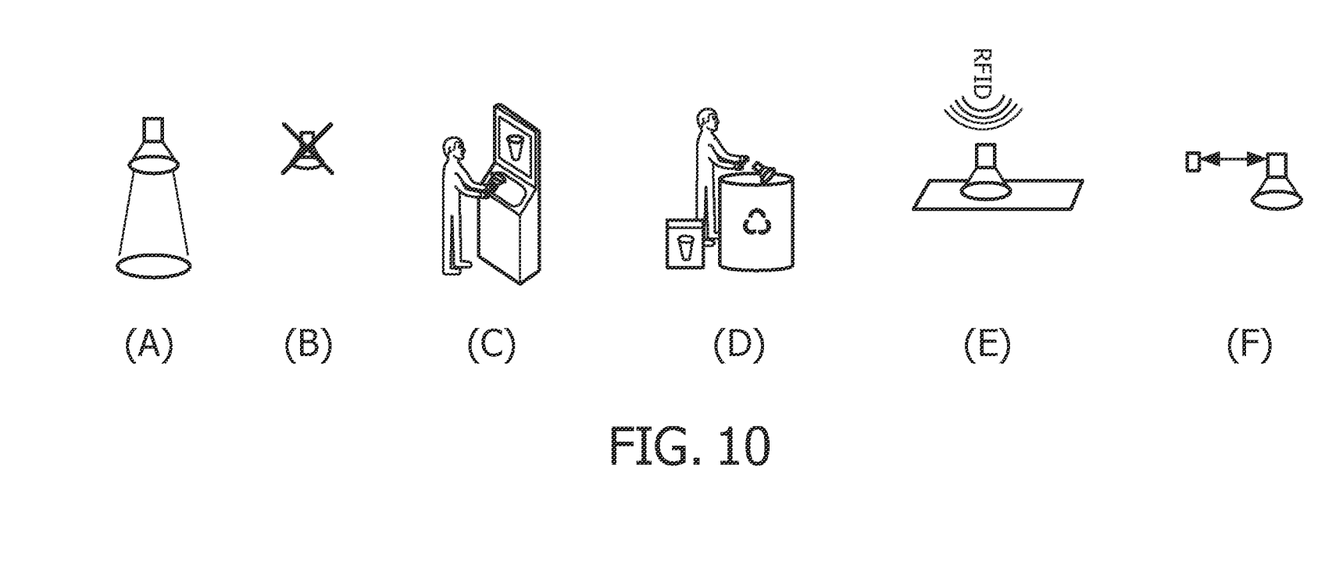
FIG. 10 illustrates usage phases of a lighting product under an exemplary scenario.

FIG. 10 illustrates usage phases of a lighting product under the above scenario. FIG. 10A shows the lighting product during its normal usage phase, where usage and/or satisfaction data is stored within an internal memory unit. FIG. 10B represents end-of-life of the lighting product. FIG. 10C depicts a user with the end-of-life lighting product interacting with a recommender system, where the user receives information to select a replacement lighting product. FIG. 10D shows the user with a purchased replacement product discarding the end-of-life lighting product in a recycle bin. FIG. 10E shows the end-of-life product being scanned to wirelessly recover reclamation information. FIG. 10F shows components being separated from the end-of-life lighting product for re-use.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

It should also be understood that, unless clearly indicated to the contrary, in any methods claimed herein that include more than one step or act, the order of the steps or acts of the method is not necessarily limited to the order in which the steps or acts of the method are recited. Also, reference numerals appearing in the claims, if any, are provided merely for convenience and should not be construed as limiting the claims in any way.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The invention claimed is:

1. A computer implemented method, comprising the steps of:
accessing a memory in a lighting product after an end-of-life of said lighting product, wherein operating information denoting actual usage of said lighting product is accumulated and written into said memory during a lifetime of said lighting product;
recovering, by a processor, the operating information from said memory;
selecting, by the processor, a replacement product from a product database based upon said operating information; and
displaying, by a display device, product information for said replacement product,
wherein the selecting comprises determining lighting settings selected by a user for said lighting product from said operating information, generating a query to the product database, said query including operational characteristics matching the lighting settings, and selecting said replacement product such that said replacement product provides said operational characteristics.

2. The method of claim 1, further comprising the steps of receiving said lighting product in a socket and applying power to said socket.

3. The method of claim 1, further comprising the step of connecting to a wireless interface in said lighting product.

4. The method of claim 1, further comprising the steps of recovering static product information from said memory and sorting said lighting product with other lighting products based on said static product information.

5. The method of claim 1, further comprising the step of updating said database based on said operating information.

6. The method of claim 1, wherein said lighting settings denote characteristics of light output from said lighting product that are selected by the user from a plurality of characteristics of light that are producible by the lighting product.

7. The method of claim 6, wherein said selected characteristics of light comprise a color of light output from said lighting product and wherein said plurality of characteristics comprise a plurality of colors.

8. The method of claim 1, wherein said operational characteristics are different from operational characteristics that said lighting product is structured to provide.

9. A recommender system, comprising:
a processor;
a lighting product interface in communication with said processor;
a database accessible by said processor containing lighting product information; and
a display device in communication with said processor;
wherein said processor is configured to perform the steps of:
accessing a memory in a source lighting product via said interface, wherein operating information denoting actual usage of said source lighting product is accumulated and written into said memory during a lifetime of said source lighting product;
recovering the operating information from said memory;
selecting a replacement lighting product for said source lighting product from said database based at least in part upon said operating information; and
displaying said lighting product information for said replacement lighting product on said display device,
wherein the selecting comprises determining lighting settings selected by a user for said source lighting product from said operating information, generating a query to the database, said query including operational characteristics matching the lighting settings, and selecting said replacement lighting product such that said replacement lighting product provides said operational characteristics.

10. The recommender system of claim 9, wherein said source lighting product is an end-of-life lighting product.

11. The recommender system of claim 10, wherein said selecting a replacement lighting product for said source lighting product from said database is based at least in part upon static source product information recovered from said memory.

12. The recommender system of claim 10, wherein said interface further comprises: a first wireless interface in wireless communication with a second wireless interface of said source lighting product.

13. The recommender system of claim 10, wherein said interface further comprises: a first wired interface in electrical communication with a second wired interface of said source lighting product.

14. The recommender system of claim 9, wherein said operating information comprises user satisfaction data.

15. The recommender system of claim 9, wherein said operational characteristics are different from operational characteristics that said source lighting product is structured to provide.

16. The recommender system of claim 9, wherein said lighting settings denote characteristics of light output from said source lighting product that are selected by the user from a plurality of characteristics of light that are producible by the source lighting product.

17. The recommender system of claim 16, further comprising the source lighting product.

18. The recommender system of claim 16, wherein said selected characteristics of light comprises a color of light output from said source lighting product and wherein said plurality of characteristics comprise a plurality of colors.

19. The recommender system of claim 18, further comprising the source lighting product.

20. A computer implemented method, comprising the steps of:
accessing a memory in a lighting product after an end-of-life of said lighting product, wherein operating information denoting actual usage of said lighting product is accumulated and written into said memory during a lifetime of said lighting product;
recovering, by a processor, the operating information from said memory;
selecting, by the processor, a replacement product, as a replacement of said lighting product, from a product database based upon said operating information; and
displaying, by a display device, product information for said replacement product, wherein said replacement product is structured to have operational characteristics that are different from operational characteristics that said lighting product is structured to have.

* * * * *